(12) United States Patent
Ito (10) Patent No.: US 9,859,343 B2
(45) Date of Patent: Jan. 2, 2018

(54) DISPLAY DEVICE

(71) Applicant: Japan Display Inc., Tokyo (JP)

(72) Inventor: Ryoichi Ito, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/492,083

(22) Filed: Apr. 20, 2017

(65) Prior Publication Data

US 2017/0338287 A1 Nov. 23, 2017

(30) Foreign Application Priority Data

May 18, 2016 (JP) ................................. 2016-099375

(51) Int. Cl.
| | |
|---|---|
| *H01L 29/18* | (2006.01) |
| *H01L 33/00* | (2010.01) |
| *H01L 27/32* | (2006.01) |
| *H01L 51/00* | (2006.01) |
| *G06F 3/044* | (2006.01) |
| *G09G 3/3225* | (2016.01) |

(52) U.S. Cl.
CPC ............ *H01L 27/323* (2013.01); *G06F 3/044* (2013.01); *H01L 51/0097* (2013.01); *G06F 2203/04102* (2013.01); *G06F 2203/04105* (2013.01); *G09G 3/3225* (2013.01); *G09G 2310/08* (2013.01); *H01L 27/3244* (2013.01); *H01L 2251/5338* (2013.01)

(58) Field of Classification Search
CPC .............. H01L 27/323; H01L 51/0097; H01L 27/3244; H01L 2251/5338; G06F 3/044; G06F 2203/04105; G06F 2203/04102; G09G 2310/08; G09G 3/3225
See application file for complete search history.

(56) References Cited

U.S. PATENT DOCUMENTS

| | | | |
|---|---|---|---|
| 2013/0082970 A1* | 4/2013 | Frey ...................... | G06F 3/0414 345/173 |
| 2015/0200235 A1* | 7/2015 | Wang .................. | H01L 27/3225 257/40 |
| 2017/0110504 A1* | 4/2017 | Panchawagh ........... | H01L 27/20 |
| 2017/0123281 A1* | 5/2017 | Lee ................... | G02F 1/134309 |
| 2017/0178470 A1* | 6/2017 | Khoshkava ............. | G06F 3/016 |

FOREIGN PATENT DOCUMENTS

JP  2013-529803 A  7/2013

\* cited by examiner

*Primary Examiner* — Victor A Mandala
(74) *Attorney, Agent, or Firm* — Typha IP LLC (57) ABSTRACT

A display device includes a flexible substrate having a display region including a plurality of pixels, each of the plurality of pixels having a pair of electrodes and a display element therebetween; a first electrode layer provided on the plurality of pixels; a second electrode layer provided on the first electrode layer; a third electrode layer provided on the second electrode layer; a piezoelectric material layer provided between the first electrode layer and the second electrode layer; and a flexible material layer provided between the second electrode layer and the third electrode layer.

7 Claims, 13 Drawing Sheets

DISPLAY DEVICE

CROSS REFERENCE TO RELATED APPLICATIONS

This application is based on and claims the benefit of priority from the prior Japanese Patent Application No. 2016-099375, filed on 18 May 2016, the entire contents of which are incorporated herein by reference.

FIELD

The present invention relates to a display device, and specifically, to a display device including a touch sensor, a press sensor and a bending sensor.

BACKGROUND

An organic electroluminescence display device (hereinafter, referred to as an "organic EL display device") includes a light emitting element in each of pixels, and controls the light emission of each individual light emitting element to display an image. A light emitting element includes a pair of electrodes, one of which is an anode electrode and the other of which is a cathode electrode, and a layer containing an organic EL material (hereinafter, referred to also as a "light emitting layer") held between the pair of electrodes. When electrons are injected from the cathode electrode into the light emitting layer and holes are injected from the anode electrode into the light emitting layer, the electrons and holes are recombined. Extra energy released by the recombination excites and then de-excites light emitting molecules in the light emitting layer. As a result, light is emitted.

In an organic EL display device, the anode electrode of each of the light emitting elements is provided as a pixel electrode in each of the pixels. The cathode electrode is provided over a plurality of pixels as a common electrode supplied with a common potential. In the organic EL display device, a potential of the pixel electrode is applied to the corresponding pixel with respect to the potential of the common electrode, so as to control the light emission of the pixel.

Recently, a technology of providing a sensor detecting a touch and a sensor detecting a pressure (press) in a flexible organic EL display device is has been developed.

For example, Japanese PCT National-Phase Laid-Open Patent Publication No. 2013-529803 discloses a touch screen display sensor including a transparent touch detection element located on a surface of a transparent substrate and a force detection element located in the transparent touch detection element. The force detection element includes two sets of micromesh bands and a pressure-sensitive material provided between the micromesh bands. The micromesh bands each include a line formed of a metal conductive material. The sets of micromesh bands are separated from each other and put on planes substantially parallel to each other.

SUMMARY

A display device in an embodiment according to the present invention includes a flexible substrate having a display region including a plurality of pixels, each of the plurality of pixels having a pair of electrodes and a display element therebetween; a first electrode layer provided on the plurality of pixels; a second electrode layer provided on the first electrode layer; a third electrode layer provided on the second electrode layer; a piezoelectric material layer provided between the first electrode layer and the second electrode layer; and a flexible material layer provided between the second electrode layer and the third electrode layer.

DESCRIPTION OF EMBODIMENTS

A technology of providing a sensor detecting a touch and a sensor detecting a pressure (press) in a flexible organic EL display device has been developed. However, there is no prior example of technology of further providing a sensor detecting a bending.

For providing sensors detecting a touch, a pressure (press) and a bending in a flexible organic EL display device, there is a problem that detection signals need to be separated from each other.

The present invention has an object of providing a display device including sensors detecting a touch, a pressure (press) and a bending and allowing detection signals to be separated from each other.

Hereinafter, some embodiments of the present invention will be described in detail with reference to the drawings. A display device according to the present invention is not limited to any of the following embodiments and may be carried out in various modified forms. In all the embodiments, the same elements will bear the same reference signs. In the drawings, the relative sizes may be different from the actual relative sizes for the sake of illustration, or a part of the components may be omitted.

In this specification, the terms "up", "down" and the like used for the drawings each represent a positional relationship between a component that is a target of attention and another component. In this specification, as seen in a side view, a direction from a surface of a first substrate 104 (described below) toward a light emitting element 146 is defined as "upward", and an opposite direction thereto is defined as "downward". In this specification and the claims, an expression that one element is located "on" another element encompasses a case where the one element is located directly on another element in contact with the one element and also a case where the one element is located on another element with still another element being provided between the one element and another element, unless otherwise specified.

Embodiment 1

[External Structure]

Figure 1:
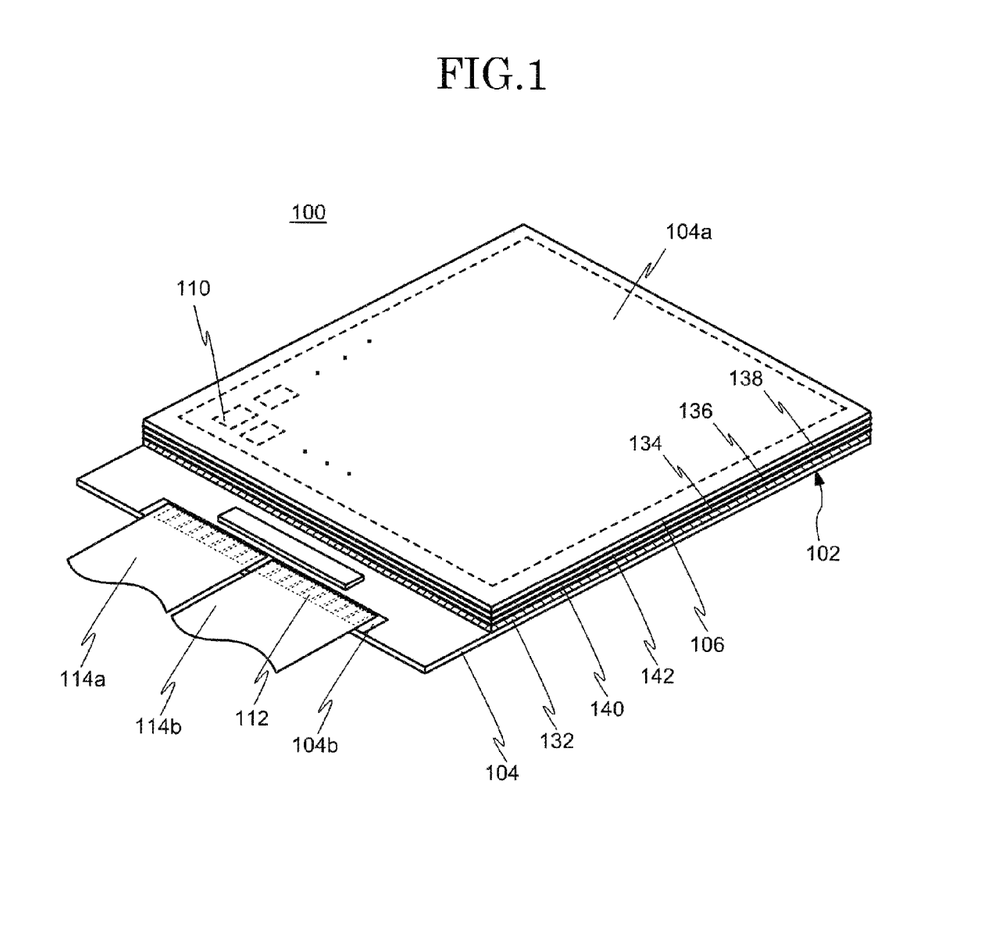
FIG. 1 is a perspective view showing an external structure of a display device in an embodiment according to the present invention.

FIG. 1 is a perspective view showing an external structure of a display device 100 in an embodiment according to the present invention. With reference to FIG. 1, the external structure of the display device 100 will be described.

The display device 100 in this embodiment includes an array substrate 102, a sealing layer 132, a first electrode layer 134, a second electrode layer 136, a third electrode layer 138, a piezoelectric material layer 142, a flexible material layer 140, a protective film 106, and a plurality of connection terminals 112.

The array substrate 102 includes at least the first substrate 104 and a plurality of pixels 110. The first substrate 104 is flexible. Such a flexible substrate is formed of a resin material although specific materials will be described below. On the first substrate 104, a display region 104a and a terminal region 104b are provided.

Figure 4A:
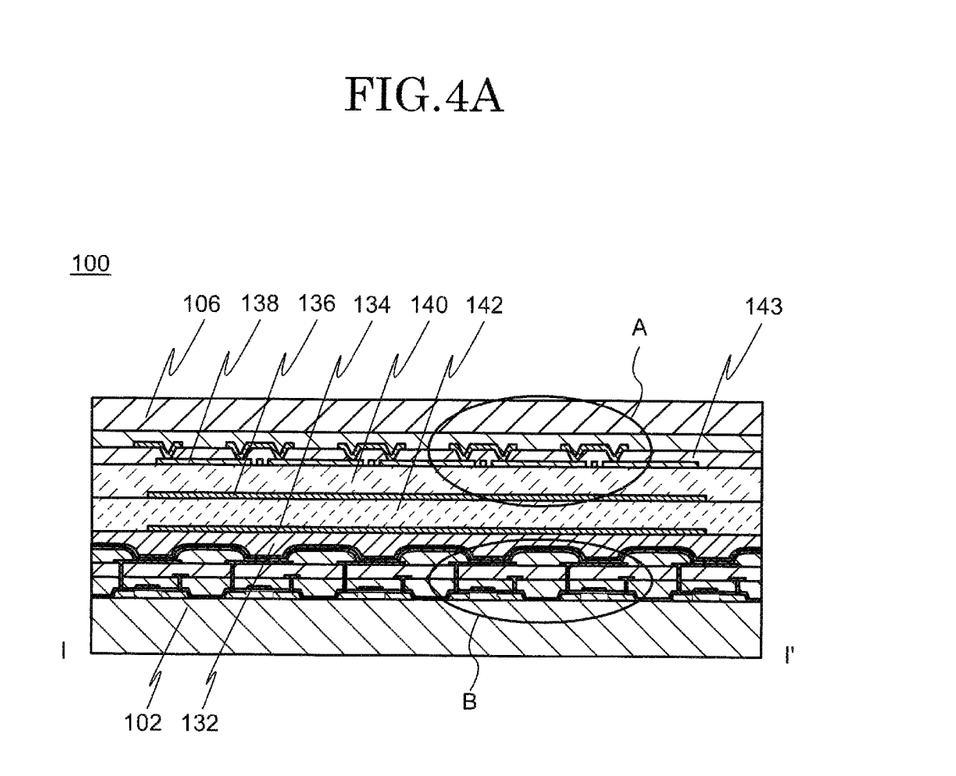
FIG. 4A is a cross-sectional view showing a structure of the display device in an embodiment according to the present invention.
Figure 4B:
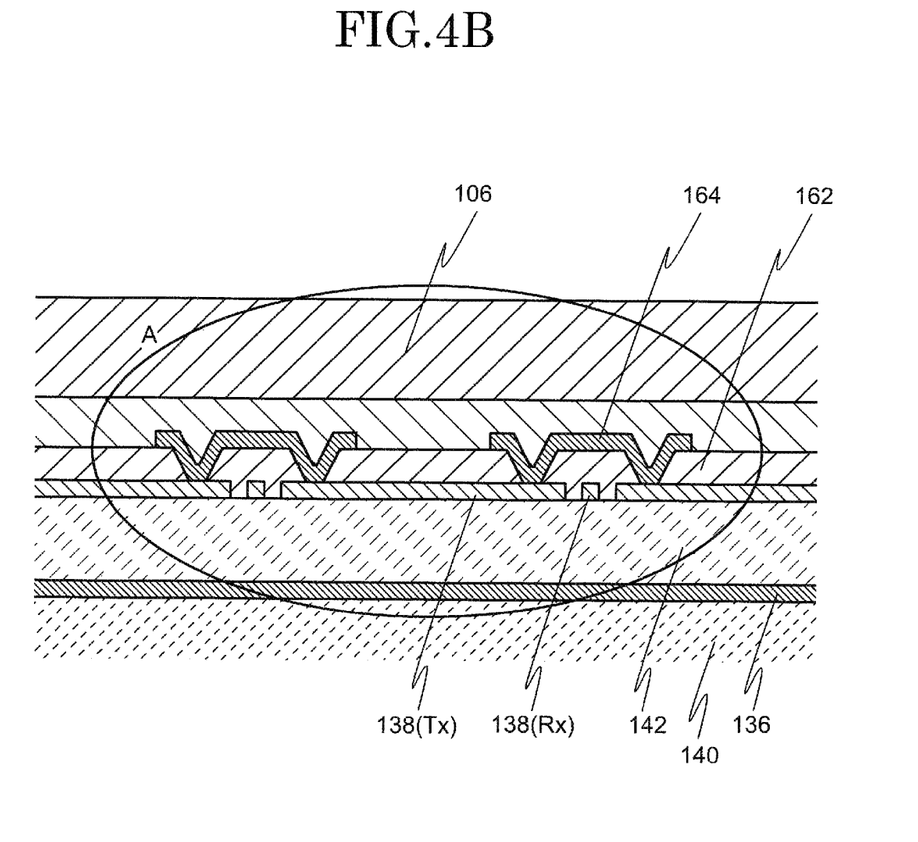
FIG. 4B is an enlarged cross-sectional view showing the structure of the display device in an embodiment according to the present invention.
Figure 4C:
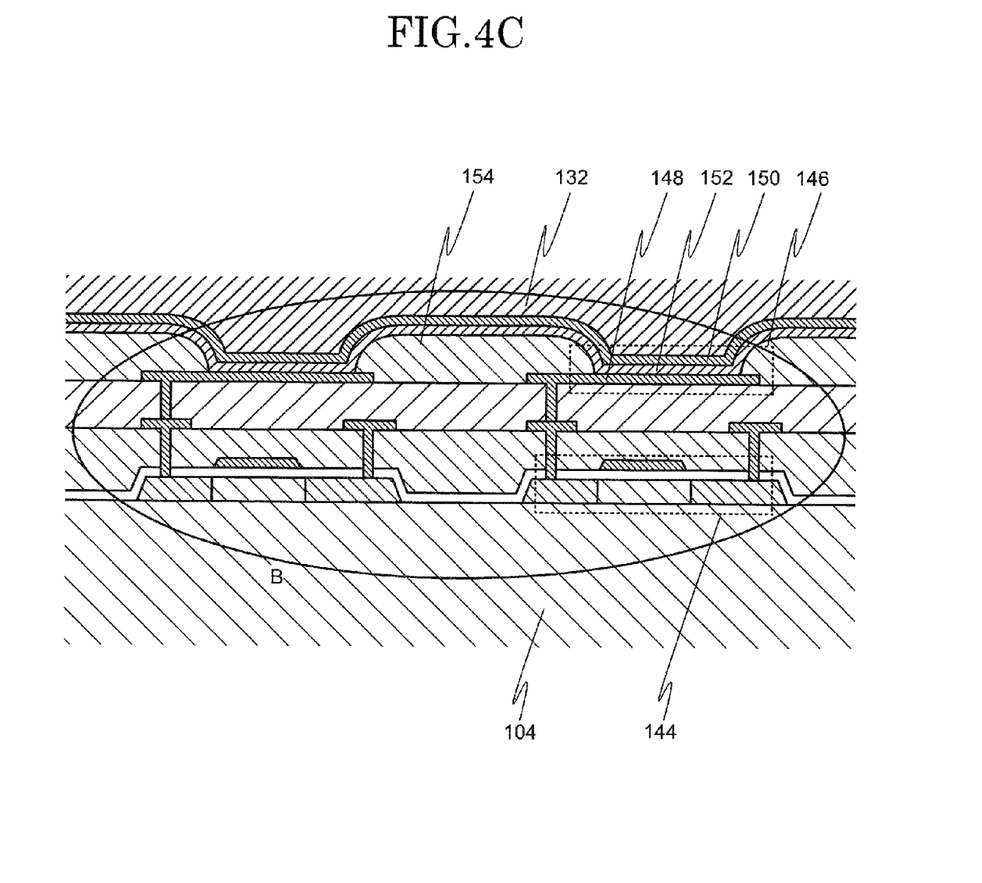
FIG. 4C is an enlarged cross-sectional view showing the structure of the display device in an embodiment according to the present invention.

The plurality of pixels 110 are arrayed in the display region 104a on the first substrate 104. In this embodiment, the plurality of pixels 110 are arrayed in a matrix. Although not shown in FIG. 1, the plurality of pixels 110 each include a pixel circuit 126 (FIG. 2) including at least a selection transistor, a driving transistor 144 (FIG. 4C) and the light emitting element 146 (FIG. 4C).

The sealing layer 132 is located on the display region 104a and covers the plurality of pixels 110. The sealing layer 132 is provided in order to prevent entrance of moisture or the like into the plurality of pixels 110 in the display device 100 from outside of the display device 100.

On the sealing layer 132, the first electrode layer 132, the piezoelectric material layer 142, the second electrode layer 136, the flexible material layer 140 and the third electrode layer 138 are stacked in this order. As described below in detail, the first electrode layer 134, the second electrode layer 136 and the piezoelectric material layer 142 are included in a bending sensor. The second electrode layer 136, the third electrode layer 138 and the flexible material layer 140 are included in a press sensor. The third electrode layer 138 is included in a touch sensor.

The plurality of connection terminals 112 are provided in the terminal region 104b. The terminal region 104b is located along one end of the first substrate 104. The plurality of connection terminals 112 are connected with a wiring substrate 114a and a wiring substrate 114b. The wiring substrate 114a connects a device outputting a video signal, a power source or the like and the display device 100 to each other. The wiring substrate 114b connects a device driving various sensors, a power source or the like and the display device 100 to each other.

The external structure of the display device 100 in this embodiment is described above. Now, with reference to the drawings, a circuit configuration of the display device 100 in this embodiment will be described.

[Circuit Configuration for Display]

Figure 2:
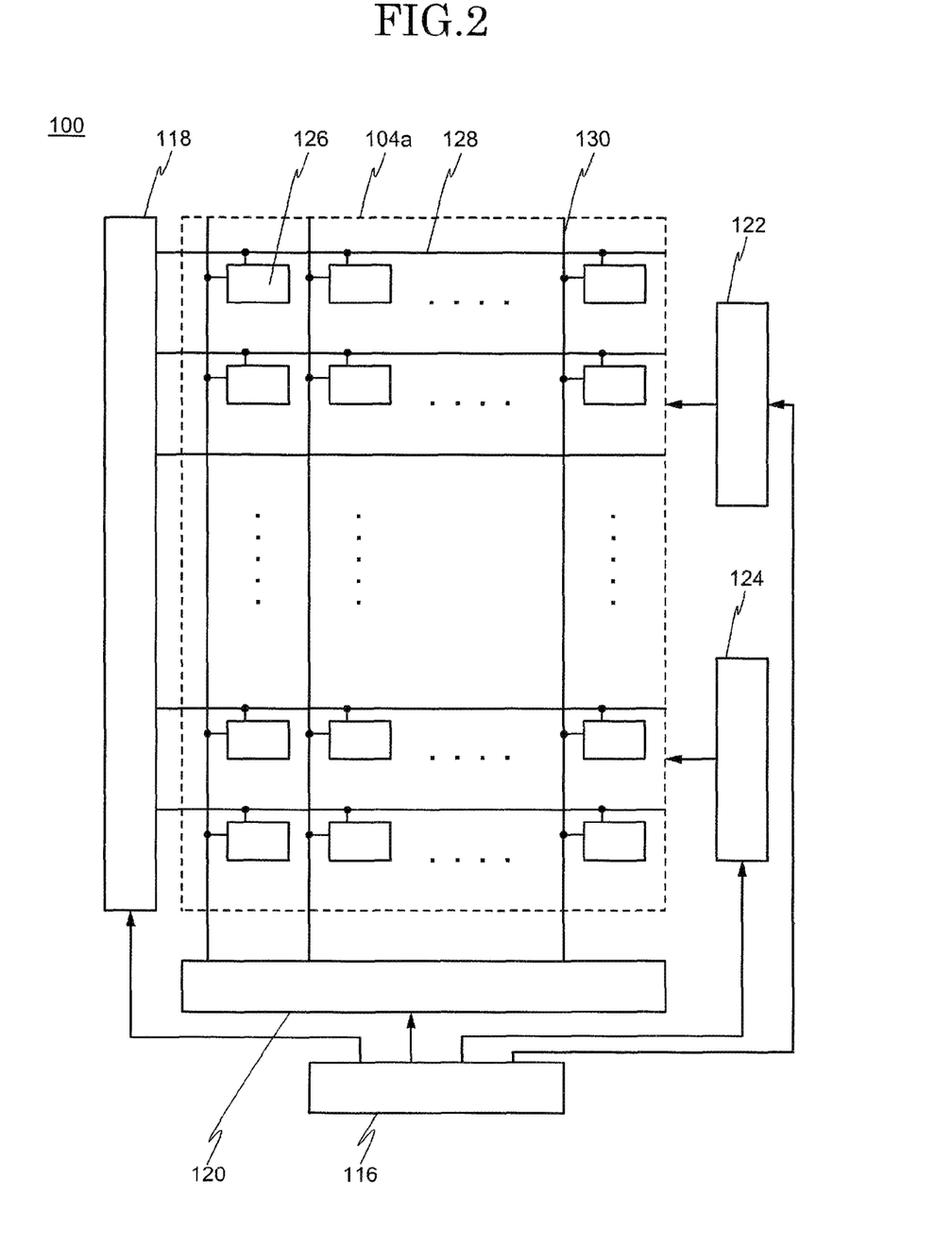
FIG. 2 is a circuit diagram showing a circuit configuration of the display device in an embodiment according to the present invention.

FIG. 2 is a circuit diagram showing a circuit configuration of the display device 100 in this embodiment. FIG. 2 shows the circuit configuration for display. A circuit configuration provided for various sensors in the display device 100 will be described below.

The display device 100 in this embodiment includes a driving circuit, the plurality of pixel circuits 126, a plurality of scanning signal lines 128, and a plurality of video signal lines 130.

The driving circuit includes a control circuit 116, a scanning line driving circuit 118, a video line driving circuit 120, a driving power source circuit 122, and a reference power source circuit 124. The driving circuit drives the pixel circuits 126 respectively provided in the plurality of pixels 110 to control the light emission of the plurality of pixels 110.

The control circuit 116 controls the operation of the scanning line driving circuit 118, the video line driving circuit 120, the driving power source circuit 122 and the reference power source circuit 124. Specifically, the control circuit 116 outputs a timing signal used for driving the scanning line driving circuit 118 and the video line driving circuit 120, supplies a video signal to the video line driving circuit 120, and determines the potential to be output from each of the driving power source circuit 122 and the reference power source circuit 124.

The scanning line driving circuit 118 is connected with the plurality of scanning signal lines 128. The plurality of scanning signal lines 128 are respectively provided for horizontal lines of the plurality of pixels 110 (pixel rows). The scanning line driving circuit 118 sequentially selects the plurality of scanning signal lines 128 in accordance with the timing signal input from the control circuit 116.

The video line driving circuit 120 is connected with the plurality of video signal lines 130. The plurality of video signal lines 130 are respectively provided for vertical lines of the plurality of pixels 110 (pixel columns). The video line driving circuit 120 receives a video signal input from the control circuit 116, and when the scanning line driving circuit 118 selects a scanning signal 128, supplies a voltage in accordance with the video signal of the selected pixel row to the plurality of video signal lies 130.

The driving power source circuit 122 is connected with driving power source lines (not shown) respectively provided for the pixel columns. The driving power source circuit 122 supplies an electric current used to allow the pixels 110 to emit light in accordance with the input video signal.

The reference power source circuit 124 is connected with a reference power source line (not shown) provided commonly to the plurality of pixels 110. The reference power source circuit 124 supplies a constant potential to the common electrode (cathode electrode) of the light emitting element provided in each of the pixel circuits 126.

The circuit configuration of the display device 100 in this embodiment is described above. Now, with reference to the drawings, the structure of the display device 100 in this embodiment will be described in detail.

Figure 3:
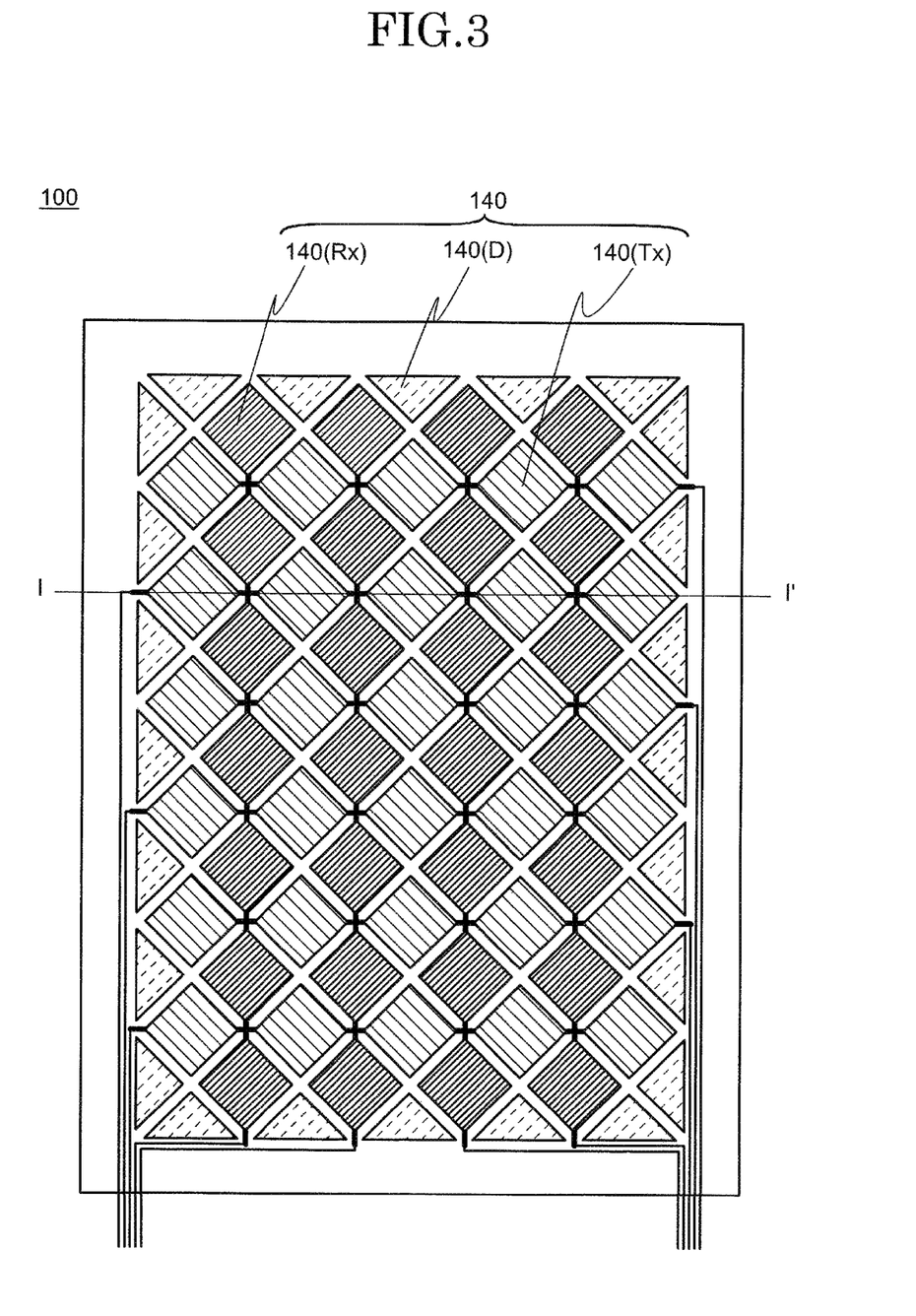
FIG. 3 is a plan view showing a structure of a sensor portion of the display device in an embodiment according to the present invention.

FIG. 3 is a plan view showing a structure of a sensor portion of the display device 100 in this embodiment. FIG. 4A is a cross-sectional view showing the structure of the display device 100 in this embodiment, and shows a cross-section taken along line I-I' in FIG. 3. FIG. 4B is an enlarged cross-sectional view showing a structure of a touch sensor portion A (FIG. 4A) in the display device 100 in this embodiment. FIG. 4C is an enlarged cross-sectional view showing a structure of a pixel portion B (FIG. 4A) in the display device 100 in this embodiment. In FIG. 4A, the pixels are shown larger than the actual size with respect to the other elements, for the sake of illustration. In actuality, the pixels 110 are sufficiently smaller than patterns of the third electrode layer 138 described below.

As shown in FIG. 1, the display device 100 in this embodiment includes the first substrate 104, the plurality of pixels 110, the sealing layer 132, the first electrode layer 134, the second electrode layer 136, the third electrode layer 138, the piezoelectric material layer 142, the flexible material layer 140, and the protective film 106.

As shown in FIG. 1, the first substrate 104 has the display region 104a and the terminal region 104b thereon. In this embodiment, the first substrate 104 is a flexible substrate. The flexible first substrate 104 is formed of a resin material. A preferably usable resin material is a polymer material including an imide bond in a repeat unit. For example, polyimide is usable as the resin material. Specifically, the first substrate 104 is a film substrate formed of polyimide molded into a sheet. With such a structure, the array substrate 102 is entirely flexible.

The plurality of pixels 110 are arrayed in the display region 104a on the first substrate 104. The plurality of pixels 110 each include the pixel circuit 126 (FIG. 2) including at least the selection transistor (not shown), the driving transistor 144 (FIG. 4C) and the light emitting element 146 (FIG. 4C).

The light emitting element 146 may be, for example, an organic EL light emitting element. The organic EL light emitting element used as the light emitting element 146 includes a pixel electrode 148, a common electrode 150 and a light emitting layer 152.

The pixel electrode 148 is located in each of the pixels 110. It is preferable that the pixel electrode 148 includes a highly reflective metal layer in order to reflect light generated in the light emitting layer 152 toward the common electrode 150. The highly reflective metal layer may be formed of, for example, silver (Ag).

The pixel electrode 148 may include a transparent conductive layer stacked on the highly reflective metal layer. Preferably, the transparent conductive layer may be formed of ITO (indium oxide containing tin oxide incorporated thereto), IZO (indium oxide-zinc oxide; registered trademark), or the like. The transparent conductive layer may contain any combination of these materials.

The common electrode 150 is located over the plurality of pixels 110. A preferable material of the common electrode 150 is light-transmissive so that light generated in the light emitting layer 152 is transmitted through the common electrode 150, and also is conductive. Specifically, it is preferable that the common electrode 150 is formed of ITO (indium oxide containing tin oxide incorporated thereto), IZO (indium oxide-zinc oxide), or the like. Alternatively, the common electrode 150 may be a metal layer having a thickness sufficiently small for the output light to be transmitted through the common electrode 150 (e.g., layer formed of an alloy of magnesium and silver).

A bank 154 is located between two pixels 110 adjacent to each other. The bank 154 is provided so as to cover peripheral regions of the pixel electrodes 148. In this embodiment, the bank 154 is formed of an insulating material. A usable insulating material may be an inorganic insulating material or an organic insulating material. An inorganic insulating material may be, for example, silicon oxide, silicon nitride, a combination thereof, or the like. An organic insulating material may be, for example, a polyimide resin, an acrylic resin, a combination thereof, or the like. A combination of an inorganic insulating material and an organic insulating material may be used. The bank 154 formed of an insulating material is located, so that shortcircuiting between the common electrode 150 and each pixel electrode 148 is prevented at an end of the pixel electrode 148. The bank 154 formed of an insulating material also insulates the pixels 110 adjacent to each other.

The light emitting layer 152 is held between the pixel electrode 148 and the common electrode 150. The light emitting layer 152 is formed of an organic EL material, which emits light when being supplied with an electric current. Such an organic EL material may be a low molecular weight-type or high molecular weight-type organic material. In the case where a low molecular weight-type organic material is used, a hole injection layer, an electron injection layer, a hole transfer layer and/or an electron transfer layer, for example, may be provided in addition to the light emitting layer 152. In FIG. 4C, the light emitting layer 152 is provided so as to cover the pixel electrodes 148 and the banks 154. The light emitting layer 152 is not limited to being provided in this manner. The light emitting layer 152 may respectively be provided at positions corresponding to each of the pixel electrodes 148 so as to cover a portion of each pixel electrode 148 that is exposed from the bank 154. In this case, such light emitting layers 152 covering different pixel electrodes 148 are formed of organic EL materials that emit light of different colors.

The sealing layer 132 is provided so as to cover the display region 104a and covers the plurality of pixels 110. The sealing layer 132 is provided in order to prevent entrance of moisture or the like into the plurality of pixels 110 in the display device 100 from outside of the display device 100. Therefore, it is preferable that the sealing layer 132 is formed of an insulating layer that has a low moisture permeability. It is preferable that the insulating material used for the sealing layer 132 is also capable of flattening the ruggedness caused by the plurality of light emitting elements 146, the banks 154 and the like located below the sealing layer 132. Therefore, it is preferable that the sealing layer 132 has a stack structure including an inorganic insulating layer having a low moisture permeability and an organic insulating layer capable of flattening the ruggedness.

The first electrode layer 134 is provided on the sealing layer 132 in a cross-sectional structure. The first electrode layer 134 is provided so as to cover the display region 104a in a planar structure.

The first electrode layer 134 overlaps the plurality of pixels 110. Therefore, the first electrode layer 134 includes a transparent conductive layer. Preferably, the transparent conductive layer may be formed of ITO (indium oxide containing tin oxide incorporated thereto), IZO (indium oxide-zinc oxide), or the like. The first electrode layer 134 may contain any combination of these materials.

Alternatively, the first electrode layer 134 may include a metal layer. In this case, the metal layer may have openings in regions overlapping the plurality of pixels 110 so as not to block the light emitted in the plurality of pixels 110.

The second electrode layer 136 is provided above the first electrode layer 134 in a cross-sectional structure. The second electrode layer 136 is provided so as to cover the display region 104a in a planar structure. The second electrode layer 136 includes a transparent conductive layer. The transparent conductive layer may be formed of any of substantially the same materials described above regarding the first electrode layer 134. Alternatively, like the first electrode layer 134, the second electrode layer 136 may include a metal layer having openings in regions overlapping the plurality of pixels 110.

The third electrode layer 138 is provided above the second electrode layer 136 in a cross-sectional structure. The third electrode layer 138 includes a plurality of electrodes arrayed in a matrix in a planar structure.

The third electrode layer 138 includes a transparent conductive layer. The transparent conductive layer may be formed of any of substantially the same materials described above regarding the first electrode layer 134. In addition, like the first electrode layer 134, the third electrode layer 138 may further include a metal layer having openings in regions overlapping the plurality of pixels 110.

In this embodiment, the plurality of electrodes included in the third electrode layer are each diamond-shaped or triangular. Namely, sides of each diamond-shaped electrode, among the plurality of pixels, each make an acute angle with each of the scanning signal line 128 and the video signal line 130 (described below).

Figure 5:
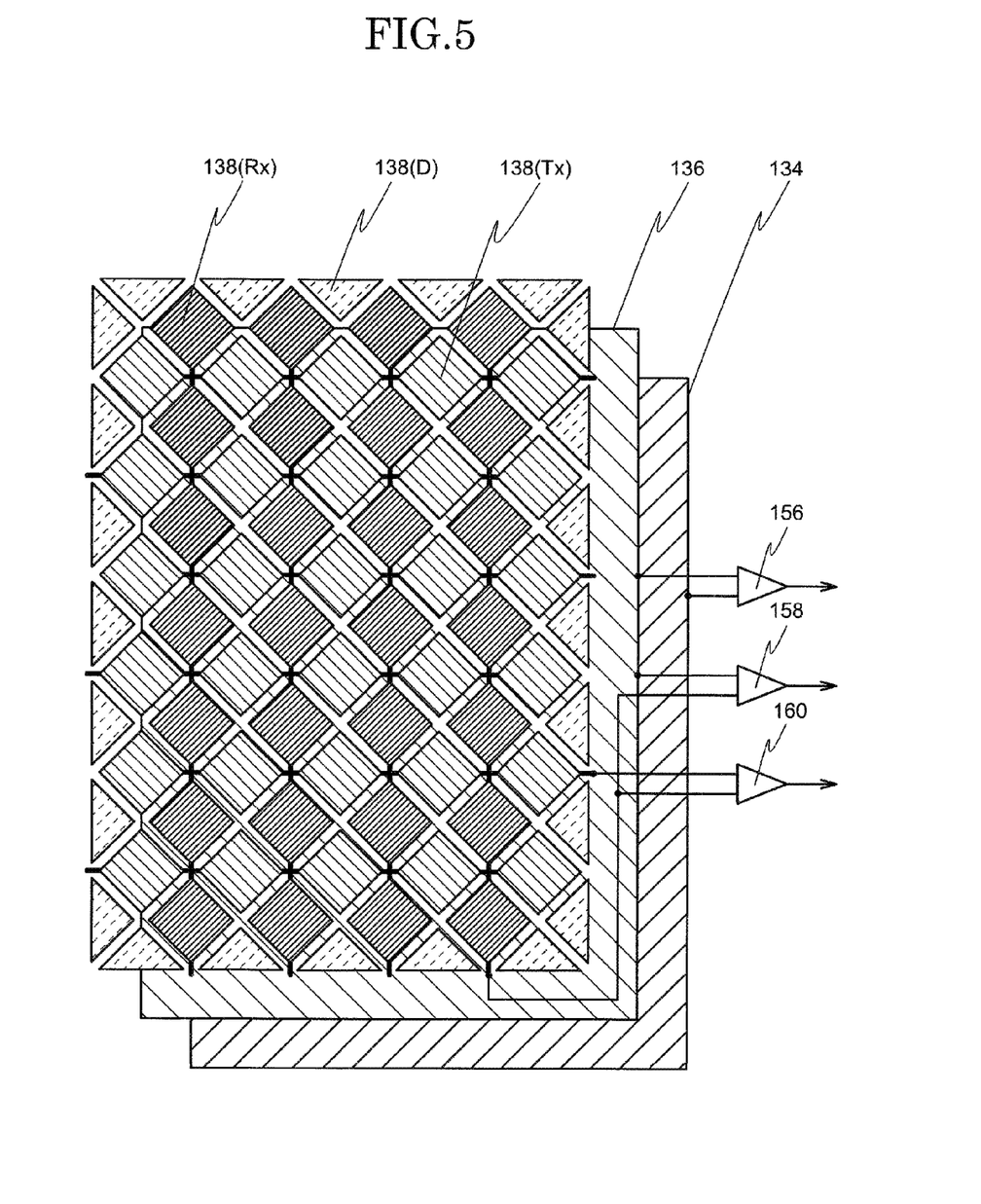
FIG. 5 shows a circuit configuration of the sensor portion of the display device in an embodiment according to the present invention.

As described below in detail, the third electrode layer 138 is included in the touch sensor. The plurality of electrodes included in the third electrode layer 138 include electrodes provided for different purposes. As shown in FIG. 5, the plurality of electrodes included in the third electrode layer 138 are classified into three types, specifically, driving electrodes Tx, detection electrodes Rx and dummy electrodes D, in accordance with the purpose thereof.

The driving electrodes Tx are arrayed in the row direction. As shown in FIG. 4B, in this embodiment, a plurality of electrodes located in each row, among the plurality of pixels arrayed in the matrix, are electrically connected with each other via a connection line 164 and thus act as the driving electrodes Tx. The connection line 164 is provided on an insulating layer 162, which is provided on the third electrode layer 138. The connection line 164 connects the electrodes adjacent to each other via a contact hole formed in the insulating layer 162. Thus, the connection line 164 and the detection electrodes Rx (described below) are prevented from being shortcircuited.

Returning to FIG. 5, the detection electrodes Rx are arrayed in the column direction. In this embodiment, a plurality of electrodes located in each column, among the plurality of pixels arrayed in the matrix, are electrically connected with each other and thus act as the detection electrodes Rx.

The dummy electrodes D are outermost electrodes among the plurality of pixels arrayed in a matrix. In this embodiment, the dummy electrodes D are triangular. The dummy electrodes D are provided in order to uniformize the pattern density of the third electrode layer 138 on the display region to decrease the ease of visibility of the third electrode layer 138. Therefore, the dummy electrodes D may be in an electrically floating state.

In this embodiment, the dummy electrodes D do not act as electrodes included in the touch sensor. Alternatively, the dummy electrodes D may be connected with either the driving electrodes Tx or the detection electrodes Rx so as to act as electrodes included in the touch sensor.

The piezoelectric material layer 142 is provided between the first electrode layer 134 and the second electrode layer 136 in a cross-sectional structure. The piezoelectric material layer 142 is provided so as to cover the display region 104a in a planar structure.

A "piezoelectric material" is a material that is, when being applied with a pressure, polarized in a direction of the pressure. More specifically, when a pressure is applied to the piezoelectric material, charges appear at a surface of the piezoelectric material as a result of the polarization and a voltage is generated inside the piezoelectric material. In this embodiment, a light-transmissive piezoelectric material is used. Specific examples of such a usable piezoelectric material include polylactic acid, poly(vinylidene fluoride), ethylene trifluoride and the like.

The flexible material layer 140 is provided between the second electrode layer 136 and the third electrode layer 138 in a cross-sectional structure. The flexible material layer 140 is provided so as to cover the display region 104a in a planar structure.

Specific example of usable flexible material includes cellulose acetate, polyurethane, acrylic acid, polyethylene (diene-based rubber), silicone rubber, fluorine-based rubber, and the like.

The first electrode layer 134, the second electrode layer 136, the third electrode layer 138, the piezoelectric material layer 142 and the flexible material layer 140 are included in the bending sensor, the press sensor or the touch sensor. A structure of each of these sensors will be described in detail with reference to the drawings.

Figure 6:
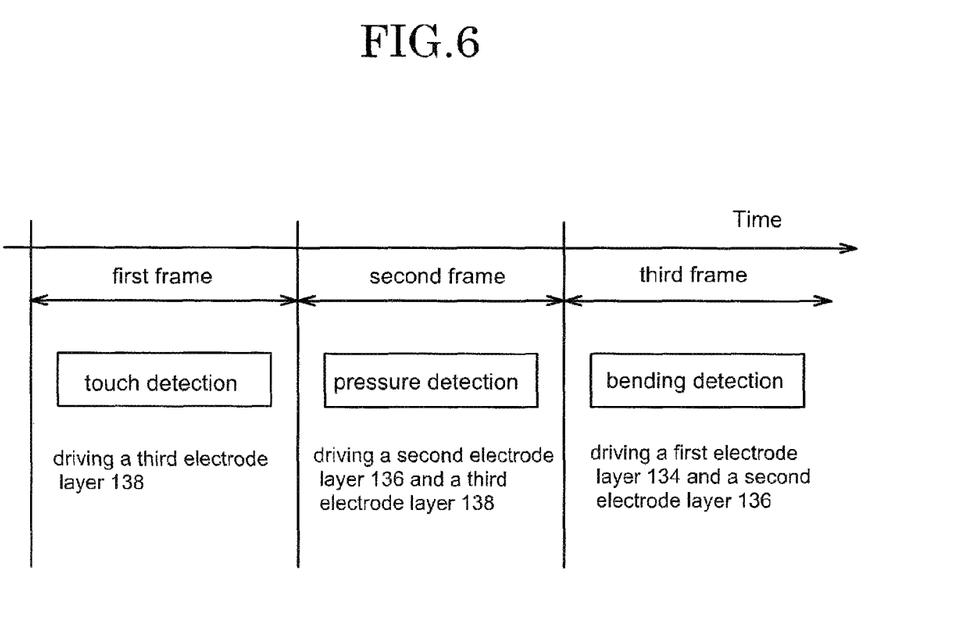
FIG. 6 shows a method for driving the sensor portion of the display device in an embodiment according to the present invention.

FIG. 5 shows a circuit configuration of the sensor portion of the display device 100 in this embodiment. FIG. 6 shows a method for driving the sensor portion of the display device 100 in this embodiment.

[Bending Sensor]

The first electrode layer 134, the second electrode layer 136 and the piezoelectric material layer 142 are included in the bending sensor. As shown in FIG. 5, the first electrode layer 134 and the second electrode layer 136 are each connected with an input terminal of a first amplifier circuit 156. The bending sensor detects a direction and an amount of the bending of the substrate.

For example, one of the first electrode layer 134 and the second electrode layer 136 is supplied with a constant potential whereas the other of the first electrode layer 134 and the second electrode layer 136 is kept in an impedance state. The constant potential is, for example, the ground potential. The other of the first electrode layer and the second electrode layer 136 is kept in, for example, a floating state in order to be in a high impedance state. When a force is applied to the display device 100 in a bending direction in this state, an electromotive force is generated in the piezoelectric material layer 142 held between the first electrode layer 134 and the second electrode layer 136. The other of the first electrode layer 134 and the second electrode layer 136 is in a high impedance state, and therefore, the voltage between the first electrode layer 134 and the second electrode layer 136 is changed in accordance with the electromotive force. Such a voltage change is detected, so that the presence/absence and the magnitude of the bending are detected.

[Press Sensor]

The second electrode layer 136, the third electrode layer 138 and the flexible material layer 140 are included in the press sensor. As shown in FIG. 5, the second electrode layer 136 and the third electrode layer 138 are each connected with an input terminal of a second amplifier circuit 158. The press sensor detects a press applied to a region overlapping the display region 104*a*.

When a pulse-like pressure detection signal is input to the second electrode layer 136, the potential of the third electrode layer 138 is changed by capacitance coupling. When a press is applied to the display region 104*a*, the thickness of the flexible material layer 140 provided between the second electrode layer 136 and the third electrode layer 138 is changed, and therefore, the capacitance between the second electrode layer 136 and the third electrode layer 138 is changed. Specifically, a press applied to the flexible material layer 140 decreases the thickness thereof, and therefore, the capacitance between the second electrode layer 136 and the third electrode layer 138 is increased. This increases the potential change in the third electrode layer 138 caused by the pressure detection signal. This potential change is detected, so that the position and the magnitude of the press are detected.

[Touch Sensor]

The third electrode layer 138 is included in the touch sensor. As shown in FIG. 5, the driving electrodes Tx and the detection electrodes Rx in the third electrode layer 138 are each connected with an input terminal of a third amplifier circuit 160. The third amplifier circuit 160 is provided in the number of the combinations of the plurality of driving electrodes Tx and the plurality of detection electrodes Rx. In this example, one third amplifier circuit 160 is shown as an example. The touch sensor detects a touch of a conductor with the region overlapping the display region 104*a*, based on mutual capacitance between the plurality of electrodes.

When a pulse-like touch detection signal is input to, for example, each row of the driving electrodes Tx, the potential of the detection electrodes Rx is changed by capacitance coupling. In the case where a finger touches any position, the detection electrode Rx forms a capacitance with the driving electrode Tx and also with the finger at the position of the touch. The capacitance between the driving electrode Tx and the detection electrode Rx is decreased by the capacitance between the detection electrode Rx and the finger. Therefore, the potential change is decreased. This potential change is detected, so that the position of the touch is detected.

The structure of the sensor portion of the display device 100 in this embodiment is described above. Now, a method for driving the sensor portion of the display device 100 in this embodiment will be described.

FIG. 6 shows a method for driving the sensor portion of the display device 100 in this embodiment. The sensor portion of the display device 100 in this embodiment is driven in a time division manner. More specifically, as shown in FIG. 6, in this embodiment, the touch sensor is driven to perform touch detection in a first frame period. Next, in a second frame period following the first frame period, the press sensor is driven to perform pressure detection. Next, in a third frame period following the second frame period, the bending sensor is driven to perform bending detection. In this manner, the driving is performed in a time division manner. Thus, detection signal components of the sensors are separated from each other.

The order of driving the sensors of the display device 100 in this embodiment is not limited to the above order. As described above, in the display device 100 in this embodiment, the second electrode layer 136 acts as one electrode of the bending sensor and also as one electrode of the press sensor. The third electrode layer 138 acts as one electrode of the press sensor and also as one electrode of the touch sensor. Namely, the sensors merely need to be driven such that the bending sensor and the press sensor are not driven at the same time and the bending sensor and the touch sensor are not driven at the same time. The touch sensor and the bending sensor may be driven at the same time. Namely, the first frame period and the third frame period may have an overlapping period.

Application Examples

Figure 7A:
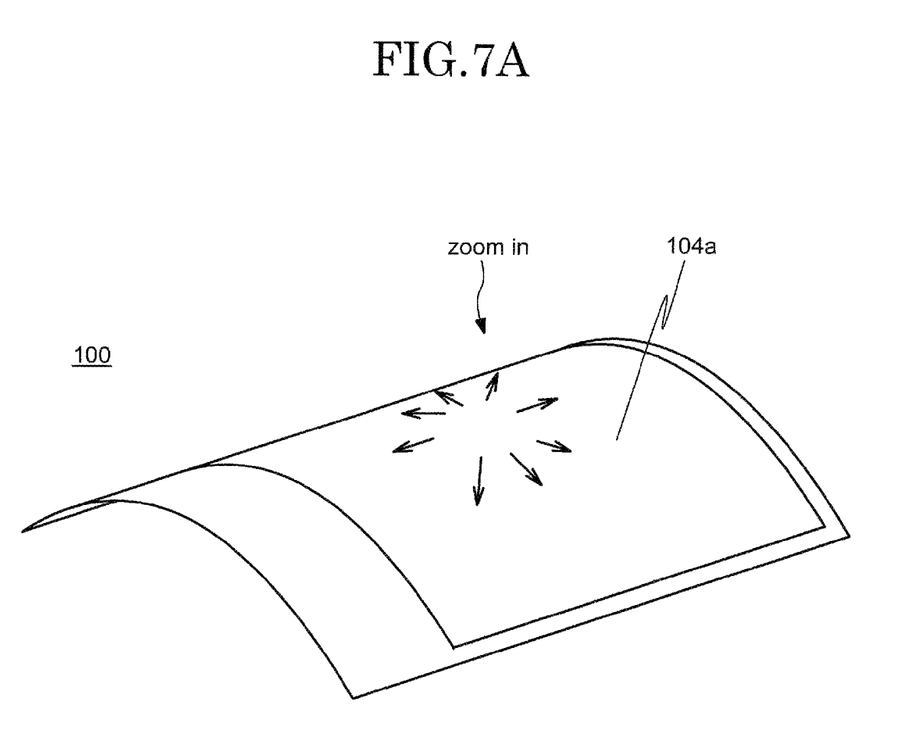
FIG. 7A is a perspective view showing an application example of the display device in an embodiment according to the present invention.
Figure 7B:
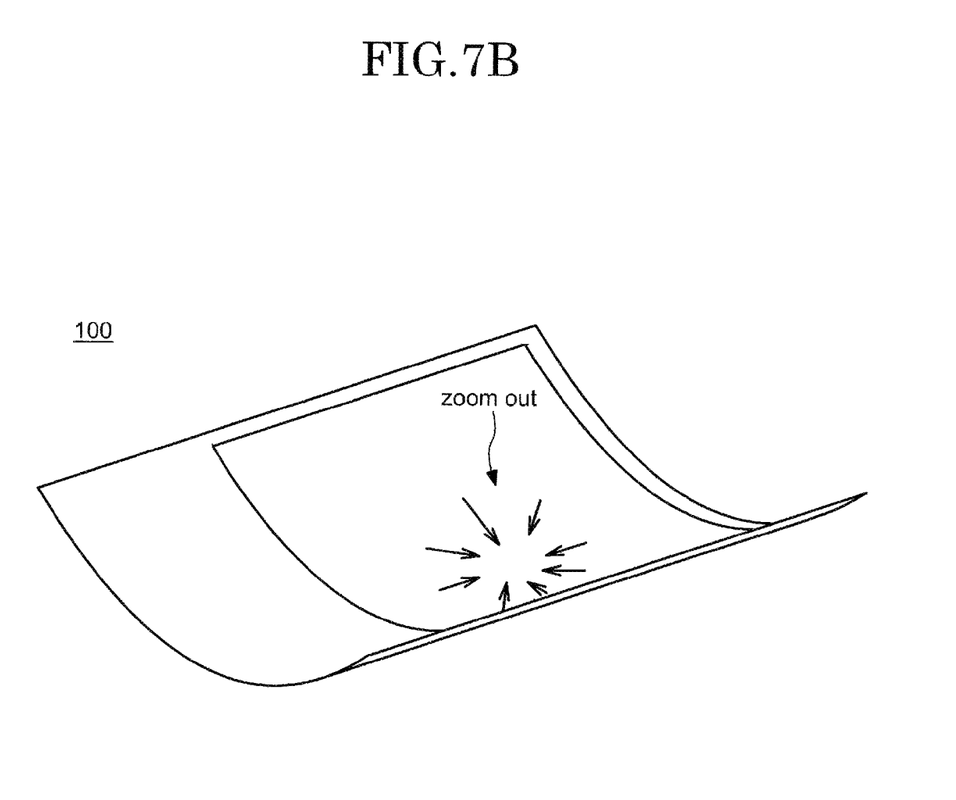
FIG. 7B is a perspective view showing an application example of the display device in an embodiment according to the present invention.

Application examples of the display device 100 in this embodiment will be described. FIG. 7A and FIG. 7B are each a perspective view showing an application example of the display device 100 in this embodiment. FIG. 7A shows a state where the display device 100 is bent such that the display surface is convexed. FIG. 7B shows a state where the display device 100 is bent such that the display surface is concaved. In the case where the display device 100 is bent such that the display surface is convexed, the displayed image is enlarged. In the case where the display device 100 is bent such that the display surface is concaved, the displayed image is reduced. Thus, the displayed image may be enlarged or reduced in association with the direction of the bending detected by the bending sensor.

The structure of the display device 100 in this example is described above. The display device 100 in this embodiment is a flexible display device including sensors performing touch detection, pressure (press) detection and bending detection, and allowing detection signals detected by these sensors to be separated from each other.

In the display device 100 in this embodiment, the second electrode layer 136 is shared by the press sensor and the bending sensor. The third electrode layer 138 is shared by the touch sensor and the bending sensor. The detection signals are separated from each other by driving the sensors in a time division manner. This simplifies the structure of the display device 100, which reduces the production cost. In addition, the sensor portion of the display device 100 is made thinner and thus is made sufficiently flexible.

Embodiment 2

[Detailed Structure]

Figure 8:
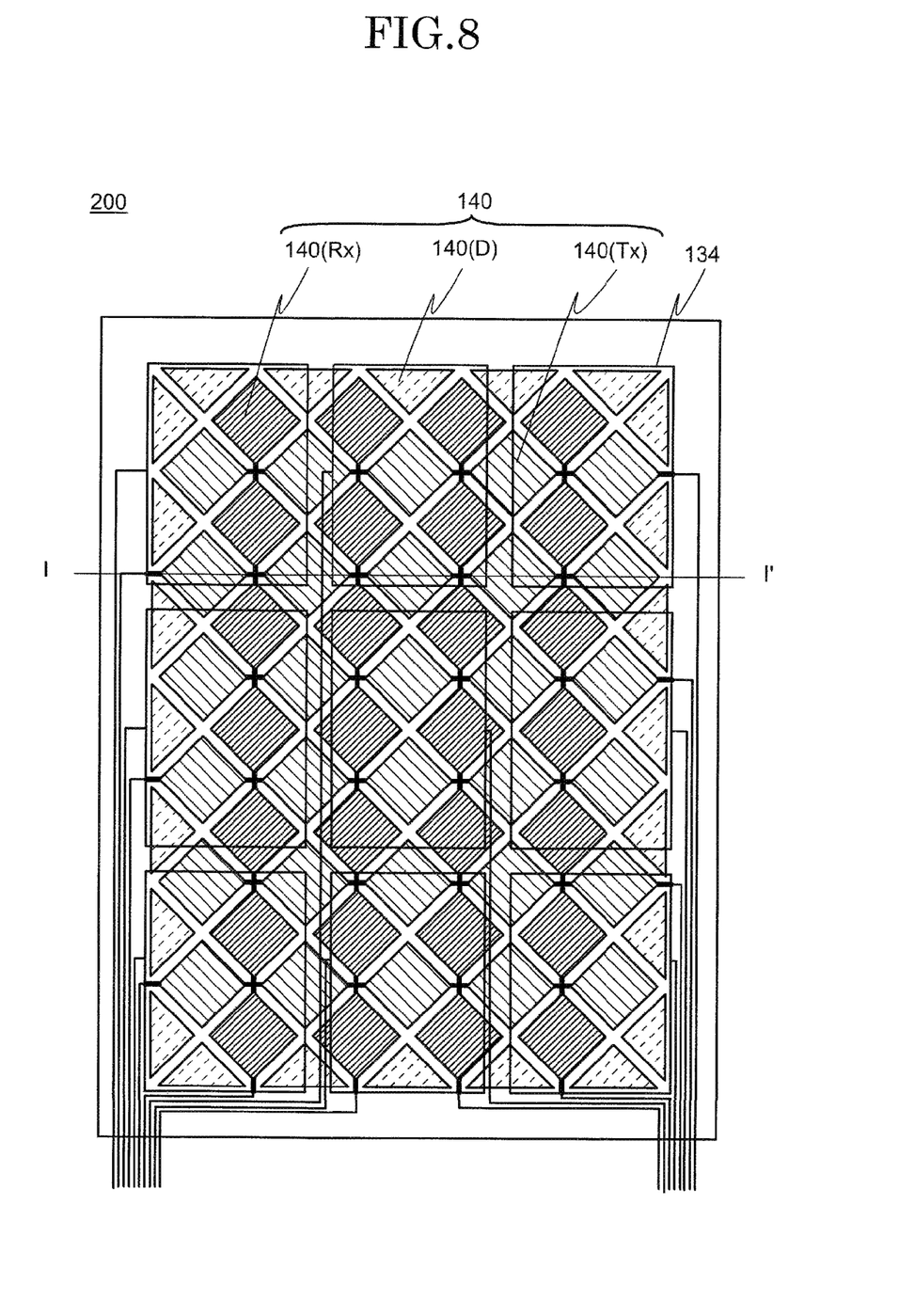
FIG. 8 is a plan view showing a structure of a sensor portion of a display device in an embodiment according to the present invention.
Figure 9:
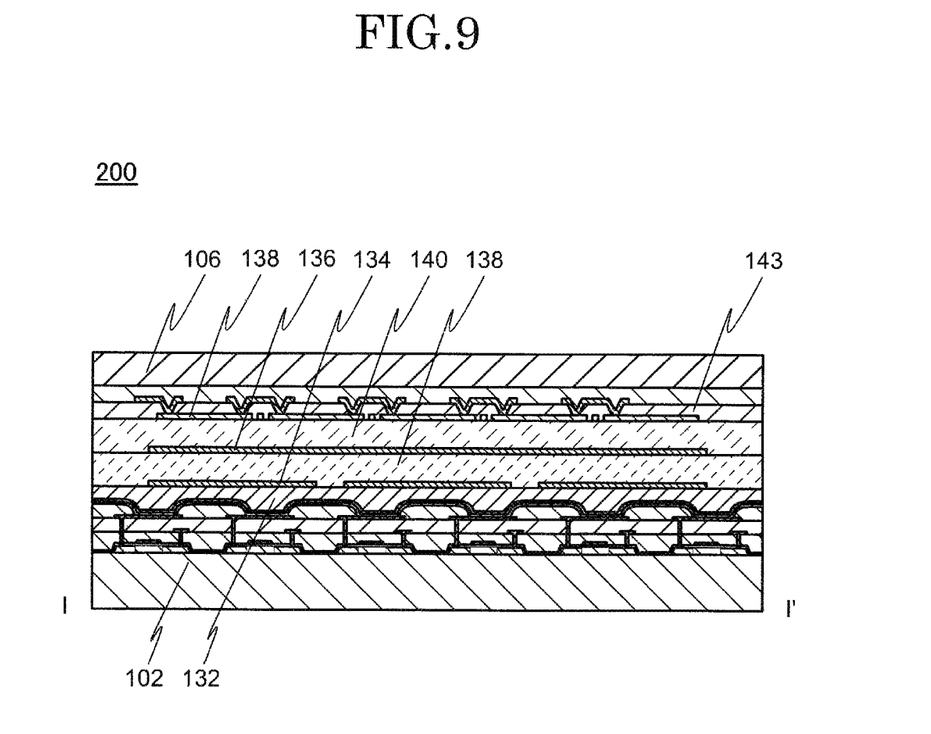
FIG. 9 is a cross-sectional view showing a structure of the display device in an embodiment according to the present invention.

FIG. 8 is a plan view showing a structure of a sensor portion of a display device 200 in this embodiment. FIG. 9 is a cross-sectional view schematically showing a structure of the display device 200 in this embodiment. Specifically, FIG. 9 shows a cross-section taken along line I-I' in FIG. 8. The display device 200 in this embodiment is different from the display device 100 in embodiment 1 in the structure of the first electrode layer 134.

Specifically, the first electrode layer 134 in this embodiment includes a plurality of electrodes arrayed in at least one of a row direction and a column direction. In this embodiment, the first electrode layer 134 includes nine electrodes. More specifically, three electrodes are arrayed in the row direction, and three electrodes are arrayed in the column direction.

Such a structure allows a more complicated bending operation to be detected. More specifically, the sensor portion of the display device 200 detects whether the display device 200 has been bent or not, the magnitude of the bending, and also the position of the bending.

Application Example

Figure 10:
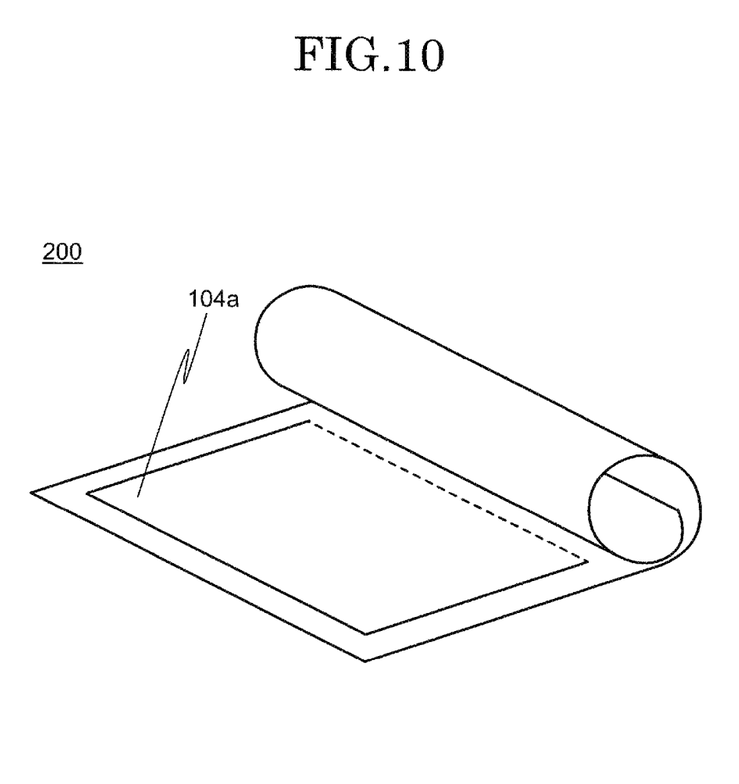
FIG. 10 shows an application example of the display device in an embodiment according to the present invention.

An application example of the display device 200 in this embodiment will be described. FIG. 10 is a perspective view showing an application example of the display device 200 in this embodiment. FIG. 10 shows the display device 200 in a state where a portion thereof in the vicinity of one end is rolled to be cylindrical. An image is displayed in a part of the display region 104a that is visible in this state. Namely, no image is displayed in a part of the display region 104a that is made invisible as a result of the display device 200 being rolled to be cylindrical. In this manner, a plurality of parts of the display region 104a may each be switched to a display state or to a non-display state in association with the magnitude of the bending detected in the part.

The structure of the display device 200 in this embodiment is described above. The display device 200 in this embodiment is a flexible display device including sensors performing touch detection, pressure (press) detection and bending detection, and allowing detection signals detected by these sensors to be separated from each other. In addition, the display device 200 in this embodiment detects a complicated bending operation.

Preferable embodiments of the present invention have been described. These embodiments are merely examples, and the technological scope of the present invention is not limited to any of the above-described embodiments. A person of ordinary skill in the art would make various alterations or modifications without departing from the gist of the present invention. Such alterations and modifications should be construed as being encompassed in the technological scope of the present invention.

The above-described embodiments may be combined in any appropriate manner unless contradicting each other. The devices described above in embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in a condition optionally by a person of ordinary skill in the art. Such devices and methods are encompassed in the scope of the present invention as long as including the gist of the present invention.

Even functions and effects that are different from those provided by the above-described embodiments but are obvious from the description of this specification or are easily expectable by a person of ordinary skill in the art are naturally construed as being provided by the present invention.

The invention claimed is:

1. A display device, comprising:
    a flexible substrate having a display region, the display region including a plurality of pixels, each of the plurality of pixels having a pair of electrodes and a display element therebetween;
    a first electrode layer provided on the plurality of pixels;
    a second electrode layer provided on the first electrode layer;
    a third electrode layer provided on the second electrode layer;
    a piezoelectric material layer provided between the first electrode layer and the second electrode layer; and
    a flexible material layer provided between the second electrode layer and the third electrode layer.

2. The display device according to claim 1, wherein:
    the first electrode layer, the second electrode layer and the piezoelectric material layer are included in a bending sensor detecting a direction and an amount of a bending of the substrate;
    the second electrode layer, the third electrode layer and the flexible material layer are included in a press sensor detecting a pressure applied to a region overlapping the display region; and
    the third electrode layer includes a plurality of electrodes arrayed in a matrix and is included in a touch sensor detecting a touch of a conductor with the region overlapping the display region based on mutual capacitance between the plurality of electrodes.

3. The display device according to claim 1, wherein at least one of the first electrode layer, the second electrode layer and the third electrode layer includes a transparent conductive layer.

4. The display device according to claim 1, wherein at least one of the first electrode layer, the second electrode layer and the third electrode layer includes a metal layer including openings in regions overlapping the plurality of pixels.

5. The display device according to claim 1, wherein the first electrode layer includes a plurality of electrodes arrayed in at least one of a row direction and a column direction.

6. The display device according to claim 2, wherein the display device is configured to perform driving in a time division manner such that:
    the touch sensor is driven in a first frame period;
    the press sensor is driven in a second frame period; and
    the bending sensor is driven in a third frame period.

7. The display device according to claim 6, wherein the first frame period and the third frame period include an overlapping period.

* * * * *